United States Patent [19]

Hwang

[11] Patent Number: 5,552,251
[45] Date of Patent: Sep. 3, 1996

[54] RETICLE AND METHOD FOR MEASURING ROTATION ERROR OF RETICLE BY USE OF THE RETICLE

[75] Inventor: Joon Hwang, Ichonkun, Rep. of Korea

[73] Assignee: Hyundai Electronics Industries Co., Ltd., Rep. of Korea

[21] Appl. No.: 414,110

[22] Filed: Mar. 31, 1995

[30] Foreign Application Priority Data

Apr. 1, 1994 [KR] Rep. of Korea ................... 1994-6961

[51] Int. Cl.⁶ ........................................................ G03F 9/00
[52] U.S. Cl. ................................. 430/5; 430/22; 437/229
[58] Field of Search ........................ 430/22, 5; 437/229

[56] References Cited

U.S. PATENT DOCUMENTS 5,017,514  5/1991  Nishimoto ............................ 430/311
5,262,258  11/1993  Yanagisawa ........................... 430/22

*Primary Examiner*—S. Rosasco
*Attorney, Agent, or Firm*—Merchant, Gould, Smith, Edell, Welter & Schmidt

[57] ABSTRACT

A reticle provided with mother and son verniers for measuring a rotation of the reticle, the mother vernier being disposed at a portion of the reticle, which portion corresponds to a center of a lens equipped in the exposure equipment using the reticle. At least one pair of son verniers are disposed at areas of the reticle uniformly spaced apart from the mother vernier along a horizontal line passing through the mother vernier, respectively. The reticle provides a means and method of minimizing an error caused by a distortion of a lens and precisely measuring a rotation error.

4 Claims, 1 Drawing Sheet

RETICLE AND METHOD FOR MEASURING ROTATION ERROR OF RETICLE BY USE OF THE RETICLE

BACKGROUND OF THE INVENTION

1. Field of the Invention

The present invention relates to a reticle constructed to measure a rotation error of the reticle on a wafer caused by an alignment error of the exposure equipment, and a method for measuring the rotation error of the reticle by use of the reticle itself.

2. Description of the Prior Art

In a contact printing carried out in a manner where a mask is in contact with a photoresist film during a light exposure step, there is a problem that the mask is quickly degraded after several uses thereof. In order to avoid such a problem, a projection printing has frequently been used. A mask (hereinafter referred to as a reticle) used in this projection printing method, does not come into contact with a sample. Accordingly, the reticle can be used repeatedly without any degradation thereof. Such a reticle used for a projection system may include an array of individual circuits or may be only a part of the array. In the latter case, the pattern of the reticle is reduced and focused onto a wafer. Using a precise step-and-repeat process, an array is formed on the wafer.

In a highly integrated device, therefore, a rotation error of the reticle may be a very important factor. To this end, the reticle is generally provided with a vernier for measuring the rotation error of the reticle.

FIG. 1 is a plan view illustrating a conventional reticle capable of measuring a rotation error thereof. This conventional reticle will now be described in conjunction with FIG. 1.

As shown in FIG. 1, the reticle has a square positive area 3. Along three edges of the positive area 3, scribe lines 2 are formed. A mother vernier 4 and a son vernier 5 are provided at the scribe lines 2 formed along the left and right edges of positive area 3, respectively. The verniers 4 and 5 have a square shape. The verniers 4 and 5 are disposed on a horizontal line.

In this reticle, however, the mother and son verniers 4 and 5 are formed at positions removed from the center of the reticle (namely, positions removed from the center of a lens equipped in the exposure equipment), respectively. As a result, the mother and son verniers 4 and 5 are disposed such that they do not overlap in the center of the lens where a small lens distortion error is involved, but overlap at a peripheral portion of the lens where a large lens distortion error is involved. Consequently, it is difficult to accurately measure the rotation error of the reticle.

SUMMARY OF THE INVENTION

Therefore, an object of the invention is to solve the above-mentioned problem and, thus, to provide a reticle provided with verniers formed such that they are detected through the center area of a lens, thereby minimizing a distortion error of the lens and precisely measuring a rotation error of the reticle.

In accordance with one aspect, the present invention provides a reticle provided with mother and son verniers for measuring a rotation of the reticle, characterized by: the mother vernier disposed at a portion of the reticle, which portion corresponds to a center of a lens equipped in the exposure equipment using the reticle; and at least one pair of son verniers disposed at areas of the reticle uniformly spaced apart from the mother vernier along a horizontal line passing through the mother vernier, respectively.

In accordance with another aspect, the present invention provides a method for measuring a rotation error of a reticle by use of the reticle itself, which reticle includes a mother vernier disposed at a portion of the reticle corresponding to a center of a lens equipped in the exposure equipment using the reticle and at least one pair of son verniers disposed at areas of the reticle uniformly spaced apart from the mother vernier along a horizontal line passing through the mother vernier, respectively, comprising the steps of: measuring a rotation error under a condition where one of the son verniers is overlapped with the mother vernier and under a condition where the other son vernier is overlapped with the mother vernier, respectively; deriving a mean value of the individual rotation errors: and determining the derived mean value as a rotation error of the reticle.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
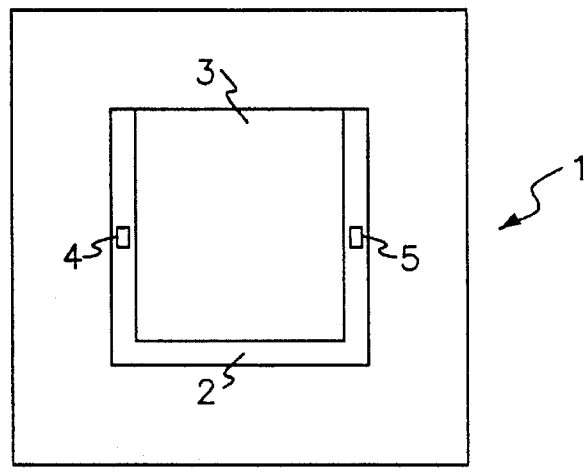
FIG. 1 is a plan view illustrating a conventional reticle provided with a construction capable of measuring a rotation error thereof.
Figure 2:
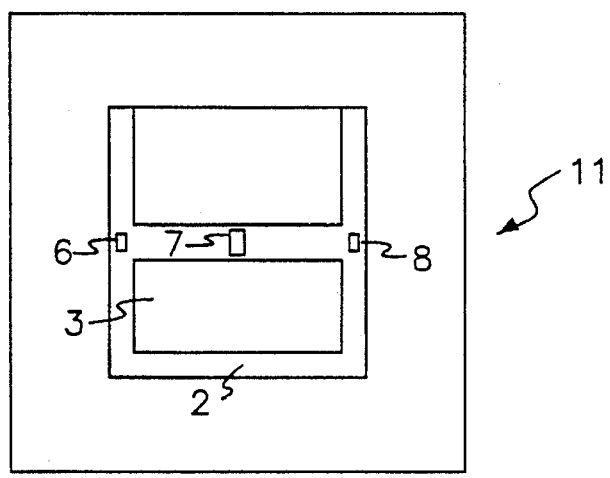
FIG. 2 is a plan view illustrating a reticle constructed to measure a rotation error thereof in accordance with an embodiment of the present invention.
Figure 3:
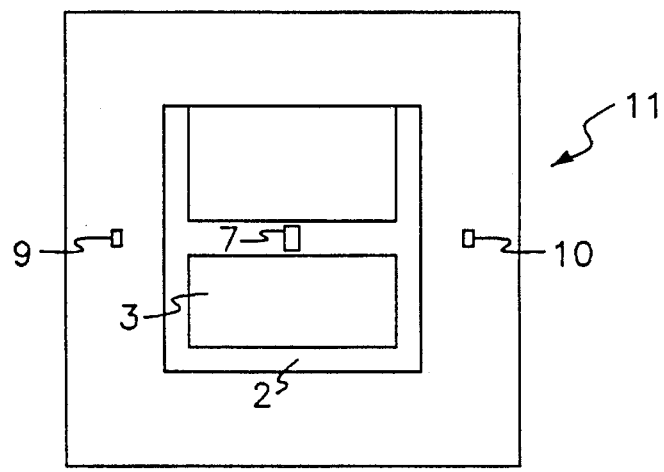
FIG. 3 is a plan view illustrating a reticle constructed to measure a rotation error thereof in accordance with another embodiment of the present invention.

FIGS. 2 an 3 are plan views respectively illustrating reticles constructed to measure a rotation error of the reticle in accordance with different embodiments of the present invention. In FIG. 2 and 3, elements respectively corresponding to those in FIG. 1 are denoted by the same reference numerals.

The reticle, which is denoted by the reference numeral 11 in FIGS. 2 and 3, is provided with a square field area 3. Along three edges and horizontally across the center of the field area 3, scribe lines 2 are formed. One of the scribe lines 2 is positioned in the center of the reticle to form a vernier pattern. In accordance with the present invention, a mother vernier 7 is provided at a portion of the scribe lines 2, which portion corresponds to the center portion of the reticle 11, that is, the center of a lens, as shown in FIG. 2. The mother vernier experiences low lens distortion error because it is positioned at the center of the lens. Son verniers, which are denoted by the reference numerals 6 and 8 in FIG. 2 or by the reference numerals 9 and 10 in FIG. 3 are also provided at areas of the reticle 11 uniformly spaced apart from the mother vernier 7 along a horizontal line passing through the mother vernier 7, respectively.

In the case of FIG. 2, the son verniers 6 and 8 are disposed at areas of the reticle 11 on the scribe lines 2 farthest spaced horizontally from the mother vernier 7. In the case of FIG. 3, the son verniers 9 and 10 are disposed at areas of the reticle 11 spaced horizontally from the mother vernier 7 beyond the scribe lines 2. In the latter case, a more precise measurement can be obtained.

It is noted that where the mother vernier 7 can not be formed at the center of the reticle 11, it should be disposed at a position nearest to the center of the reticle 11.

Now, a method for measuring a rotation error of the reticle 11 by use of the mother and son verniers provided at the reticle 11 in accordance with the present invention will be described.

In accordance with this method, first, one of the son verniers is overlapped with the mother vernier 7. Under this condition, a rotation error of the reticle 11 (Error 1) is measured. Thereafter, the other son vernier is overlapped with the mother vernier 7. Under this condition, a rotation error of the reticle 11 (Error 2) is measured. A mean value of the measured rotation errors (Errors 1 and 2) is derived. The derived mean value is the rotation error of the entire reticle. The rotation error of the reticle can be expressed by the following equation:

Rotation Error=(Error 1+Error 2)/2

The above mean value is used for correcting the rotation error of the step-an-repeat projection system.

As apparent from the above description, the present invention provides a superior means and method of minimizing an error caused by a distortion of a lens and precisely measuring a rotation error of reticle.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A reticle for measuring a rotation error of the reticle, the reticle having a first center, and being for use in exposure equipment having a lens with a second center, the reticle comprising:

a scribe line pattern traversing between opposite sides of the reticle and passing through the first center of the reticle;

a mother vernier pattern disposed on the scribe line pattern, centrally between the opposite sides, in a position corresponding to the second center of the lens; and at least one pair of son vernier patterns, one of the pair disposed toward each of the opposite sides, and the son verniers spaced apart from the mother vernier along the scribe line pattern, respectively.

2. A reticle in accordance with claim 1, wherein the son verniers are disposed on the scribe line.

3. A reticle in accordance with claim 1, wherein the son verniers are disposed beyond the scribe line.

4. A method for measuring a rotation error of a reticle by use of the reticle itself, the reticle including a scribe line pattern traversing between opposite sides of the reticle and passing through a center of the reticle, a mother vernier pattern disposed on the scribe line pattern, centrally between the opposite sides, in a position corresponding to a center of a lens equipped in exposure equipment using the reticle, and at least one pair of son vernier patterns, one of the pair disposed at toward each of the opposite sides, and the son verniers spaced apart from the mother vernier along, the scribe line pattern respectively, comprising the steps of:

measuring rotation errors under a condition where one of the son verniers is deviated from the mother vernier on a horizontal line and under a condition where the other son vernier is deviated from the mother vernier, respectively;

deriving a mean value of the measured rotation errors; and determining the derived mean value as a rotation error of the reticle.

* * * * *